(12) United States Patent
Tamaru et al.

(10) Patent No.: US 8,760,242 B2
(45) Date of Patent: Jun. 24, 2014

(54) MULTILAYER BANDPASS FILTER

(71) Applicant: Murata Manufacturing Co., Ltd., Nagaokakyo (JP)

(72) Inventors: Ikuo Tamaru, Nagaokakyo (JP); Hiroshi Masuda, Nagaokakyo (JP); Hirokazu Yazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/871,200

(22) Filed: Apr. 26, 2013

(65) Prior Publication Data

US 2013/0241672 A1 Sep. 19, 2013

Related U.S. Application Data

(63) Continuation of application No. PCT/JP2011/073493, filed on Oct. 13, 2011.

(30) Foreign Application Priority Data

Nov. 16, 2010 (JP) ................................ 2010-255462

(51) Int. Cl.
*H03H 7/12* (2006.01)
*H03H 7/01* (2006.01)
*H03H 1/00* (2006.01)

(52) U.S. Cl.
CPC ......... *H03H 7/12* (2013.01); *H03H 2001/0085* (2013.01); *H03H 7/0115* (2013.01)
USPC .......................................... 333/185; 333/176

(58) Field of Classification Search
CPC ................... H03H 2001/0085; H03H 7/0115; H03H 7/12

USPC ................................... 333/168, 175, 176, 185
See application file for complete search history.

(56) References Cited

U.S. PATENT DOCUMENTS

| 5,696,471 | A | 12/1997 | Fujiwara | |
|---|---|---|---|---|
| 2007/0241839 | A1 | 10/2007 | Taniguchi | |
| 2010/0283557 | A1* | 11/2010 | Taniguchi | 333/204 |

FOREIGN PATENT DOCUMENTS

| JP | 61-162127 U | 10/1986 |
|---|---|---|
| JP | 8-78908 A | 3/1996 |

(Continued)

OTHER PUBLICATIONS

Official Communication issued in International Patent Application No. PCT/JP2011/073493, mailed on Dec. 13, 2011.

*Primary Examiner* — Benny Lee
*Assistant Examiner* — Rakesh Patel
(74) *Attorney, Agent, or Firm* — Keating & Bennett, LLP

(57) ABSTRACT

A multilayer bandpass filter includes a first capacitor electrode of a first stage LC parallel resonator, a second capacitor electrode of a second stage LC parallel resonator, and a third capacitor electrode of a third stage LC parallel resonator. Via electrodes and a line electrode define an inductor electrode of the first stage LC parallel resonator. Via electrodes and a line electrode define an inductor electrode of the second stage LC parallel resonator. Via electrodes and a line electrode define an inductor electrode of the third stage LC parallel resonator. The inductor electrodes of the three LC parallel resonators are arranged so loop planes thereof are disposed about a center axis extending in a stacking direction of dielectric layers. This permits setting of electromagnetic coupling between the LC parallel resonators of an input and an output stage, and allows a filter's attenuation characteristics to be freely set.

20 Claims, 4 Drawing Sheets

(56) References Cited

FOREIGN PATENT DOCUMENTS

| JP | 9-92539 A | 4/1997 |
| JP | 2006-067221 A | 3/2006 |
| WO | 2007/119356 A1 | 10/2007 |

* cited by examiner

MULTILAYER BANDPASS FILTER

BACKGROUND OF THE INVENTION

1. Field of the Invention

The present invention relates to a multilayer filter including a plurality of resonators that include loop-shaped inductors and capacitor electrodes.

2. Description of the Related Art

Conventionally, high frequency bandpass filters suitable for miniaturization and low cost manufacturing are each formed by providing a plurality of LC resonators in a multilayer body in which dielectric layers and electrode layers are stacked on top of each other.

Such multilayer bandpass filters are disclosed in Japanese Unexamined Patent Application Publication No. 2006-067221 and International Publication WO 2007/119356.

Japanese Unexamined Patent Application Publication No. 2006-067221 discloses a three-stage multilayer filter in which resonators in the first stage and the third stage are jump-coupled with a coupling capacitor C3, as illustrated in FIG. 1 of Japanese Unexamined Patent Application Publication No. 2006-067221. As illustrated in FIG. 3 of Japanese Unexamined Patent Application Publication No. 2006-067221, the jump-coupling capacitor C3 is formed by arranging an electrode pattern 151 that forms an inductor L1 and an electrode pattern 153 that forms an inductor L3 so as to face an electrode pattern 161.

However, in the structure described in Japanese Unexamined Patent Application Publication No. 2006-067221, the electrode pattern 161 also faces an electrode pattern 152 that forms an inductor L2. Thus, unwanted parasitic capacitance is generated between the electrode pattern 161 and the electrode pattern 152. This poses a problem of Q deterioration in the filter and worsening attenuation characteristics.

On the other hand, International Publication WO 2007/119356 discloses a structure that reduces parasitic capacitance between an electrode pattern of a jump-coupling capacitor and a capacitance electrode pattern of a LC parallel resonator that is not coupled with the electrode pattern of the jump-coupling capacitor.

FIG. 1 illustrates a structure of one of multilayer bandpass filters disclosed in International Publication Pamphlet No. WO 2007/119356. In the multilayer bandpass filter illustrated in FIG. 1, a multilayered body includes a ground electrode forming layer 601, a capacitor electrode forming layer 302, an input-output electrode forming layer 303, a line electrode forming layer 304, and an outer layer 305. On the input-output electrode forming layer 303, there are provided input/output electrodes 621 and 622 as well as an inter input-output capacitor electrode (electrode pattern of a jump-coupling capacitor) 160. The inter input-output capacitor electrode 160 disposed between input and output capacitively couples between the input/output electrodes 621 and 622 by creating capacitance between two input/output electrodes 621 and 622. Capacitor electrodes 311, 312, and 313 on the capacitor electrode forming layer 302 face a ground electrode 309.

To reduce the parasitic capacitance between the inter input-output capacitor electrode 160 (electrode pattern of a jump-coupling capacitor) and the capacitor electrode 312 of the second stage resonator, the capacitor electrode of the second stage resonator is displaced in a direction parallel to the plane of the multilayered body relative to the capacitor electrodes of the first and third stage resonators.

According to the structure illustrated in FIG. 1, the provision of the loop type inductors is effective in improving the Q characteristic of the LC parallel resonator and improving attenuation characteristics of the filter.

Furthermore, in the structure illustrated in FIG. 1, the capacitor electrode of the second stage resonator does not overlap with the jump-coupling capacitor electrode when viewed in a stacking direction of dielectric layers. Thus, the parasitic capacitance therebetween can be reduced.

However, in the structure illustrated in International Publication WO 2007/119356, LC parallel resonators are arranged in a row such that loop planes of all the LC parallel resonators are parallel to each other when including three or more stages of LC parallel resonators. Accordingly, electromagnetic coupling between two inductor electrodes of adjacent LC parallel resonators can be adjusted. However, there is a problem that such an adjustment (setting) is hardly possible between an inductor electrode of an input stage LC parallel resonator and an inductor electrode of an output stage LC parallel resonator. Accordingly, there is a problem that the degree of freedom in adjusting (setting) a filter's attenuation characteristics (particularly positions and bands of attenuation poles) is low.

SUMMARY OF THE INVENTION

Preferred embodiments of the present invention provide a multilayer bandpass filter capable of freely setting attenuation characteristics by facilitating an easy setting up of electromagnetic coupling between an inductor electrode of an input stage LC parallel resonator and an inductor electrode of an output stage LC parallel resonator.

A multilayer bandpass filter of preferred embodiments of the present invention includes a plurality of LC parallel resonators, the plurality of LC parallel resonators including three or more LC parallel resonators, each of which includes a first capacitor electrode, a second capacitor electrode (ground electrode), and an inductor electrode; the multilayer bandpass filter being a multilayer body that includes a plurality of dielectric layers and a plurality of electrode layers; the plurality of electrode layers defining the first capacitor electrode, the second capacitor electrode that faces the first capacitor electrode, and the inductor electrode that defines a loop, the loop including a first end portion that defines a start point and is connected to the first capacitor electrode, and a second end portion that defines an end point and is connected to the second capacitor electrode; the inductor electrode including a line electrode arranged along the dielectric layer and a via electrode extending in a stacking direction of dielectric layers, wherein the inductor electrodes of the plurality of LC parallel resonators are arranged such that loop planes of the inductor electrodes are disposed in a radial arrangement about a center axis extending in the stacking direction of dielectric layers, and such that the inductor electrode of one of the LC parallel resonators which is in an input stage and the inductor electrode of another one of the LC parallel resonators which is in an output stage are next to each other.

This structure allows electromagnetic coupling to be freely set between the inductor electrode of the input stage LC parallel resonator and the inductor electrode of the output stage LC parallel resonator. Thus, filter's attenuation characteristics may be freely set.

For example, in accordance with a preferred embodiment of the present invention, the plurality of LC parallel resonators may include a first stage LC parallel resonator that defines the input stage, a third stage LC parallel resonator that defines the output stage, and a second stage LC parallel resonator. This arrangement allows the electromagnetic coupling between any pair of the inductor electrodes that define the bandpass filter to be freely set. Thus, the degree of freedom in setting up the filter's attenuation characteristics is further increased.

In the structure of the above preferred embodiments of the present invention, the loop planes of the inductor electrodes of the three LC parallel resonators may be arranged about the center axis with an equal or substantially equal angle in between.

According to this structure, when all the LC parallel resonators have the same resonance characteristic, arranging the three inductor electrodes with the equal angle in between may provide a filter in which the same attenuation characteristic can be obtained irrespective of positions of the LC parallel resonators that are connected to input/output electrodes. Thus, the input/output electrodes may be freely designed so as to fit a mounting board.

In any one of the structures of the above preferred embodiments of the present invention, the multilayer body may include a jump-coupling capacitor electrode arranged to couple the input stage LC parallel resonator and the output stage LC parallel resonator among the plurality of LC parallel resonators.

This structure allows for arrangement of the input/output LC parallel resonators in a radial arrangement while placing them next to each other. Thus, the electromagnetic coupling between the inductor electrodes of the respective LC parallel resonators may be adjusted by varying an angle in between. On the other hand, irrespective of the angle between the LC parallel resonators, the capacitance value of the jump-coupling may be determined in response to an overlapping area or distance between the capacitor electrode of the jump-coupling capacitor and the capacitor electrodes of the input/output resonators. Accordingly, the coupling between the capacitor electrodes and the coupling between the inductor electrodes may be set independently from each other. Thus, a design range of attenuation pole frequency may be expanded. It should be noted that, even in the conventional structure in which LC parallel resonators are aligned in a row, it is possible to adjust the coupling between the capacitor electrodes and the coupling between the inductor electrodes independently from each other if the capacitor electrodes of the resonator or the jump-coupling capacitor were made larger in size. However, this poses a problem of an increase in overall size.

In a preferred embodiment of the present invention, the jump-coupling capacitor electrode may be arranged at a position where, when viewed in the stacking direction of dielectric layers, the jump-coupling capacitor electrode overlaps with the capacitor electrode of the input stage LC parallel resonator and the capacitor electrode of the output stage LC parallel resonator, and does not overlap with the capacitor electrode of the other LC parallel resonator.

According to this structure, the LC parallel resonators between an input and an output are arranged next to each other. Thus, the capacitor electrode that defines the jump-coupling capacitor may establish the jump-coupling without overlapping with the other LC parallel resonator. Thus, unwanted parasitic capacitance is reduced such that a Q characteristic may improve.

In the above preferred embodiments of the present invention, the second end portion of the inductor electrode may be provided at two locations, the loop plane of each inductor electrode may include two planes, and the loop planes of the inductor electrodes of adjacent LC parallel resonators may face each other and be in parallel or substantially in parallel to each other.

According to this structure, the loop plane of each inductor electrode includes two planes, and one of the two planes of the loop plane in the inductor electrode of each LC parallel resonator faces a counterpart of the adjacent LC parallel resonator in parallel or substantially in parallel to each other. Thus, the electromagnetic coupling between the adjacent LC parallel resonators may be strengthened.

According to preferred embodiments of the present invention, the electromagnetic coupling between an inductor electrode of the input stage LC parallel resonator and an inductor electrode of the output stage LC parallel resonator may be freely set. Thus, the filter's attenuation characteristics may be freely set.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A multilayer bandpass filter according to the first preferred embodiment is described with reference to FIG. 2 to FIG. 6.

Figure 1:
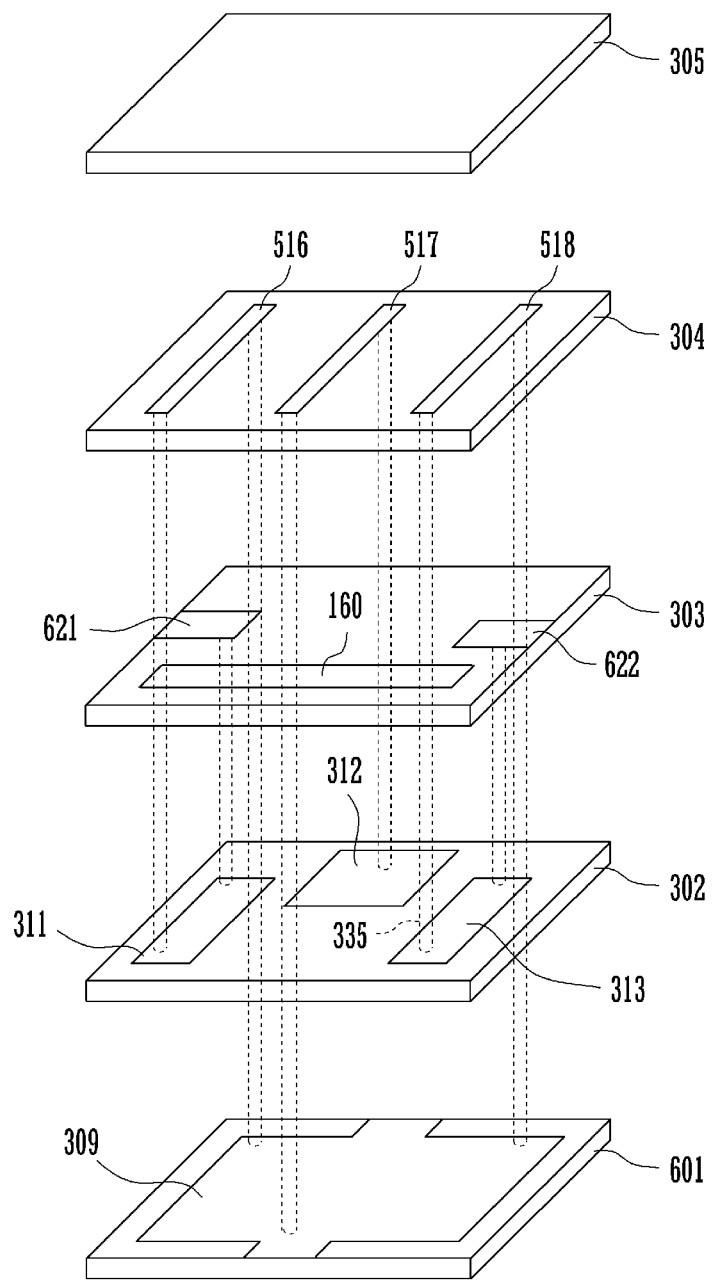
FIG. 1 is an exploded perspective view of a multilayer bandpass filter disclosed in International Publication WO 2007/119356.
Figure 2:
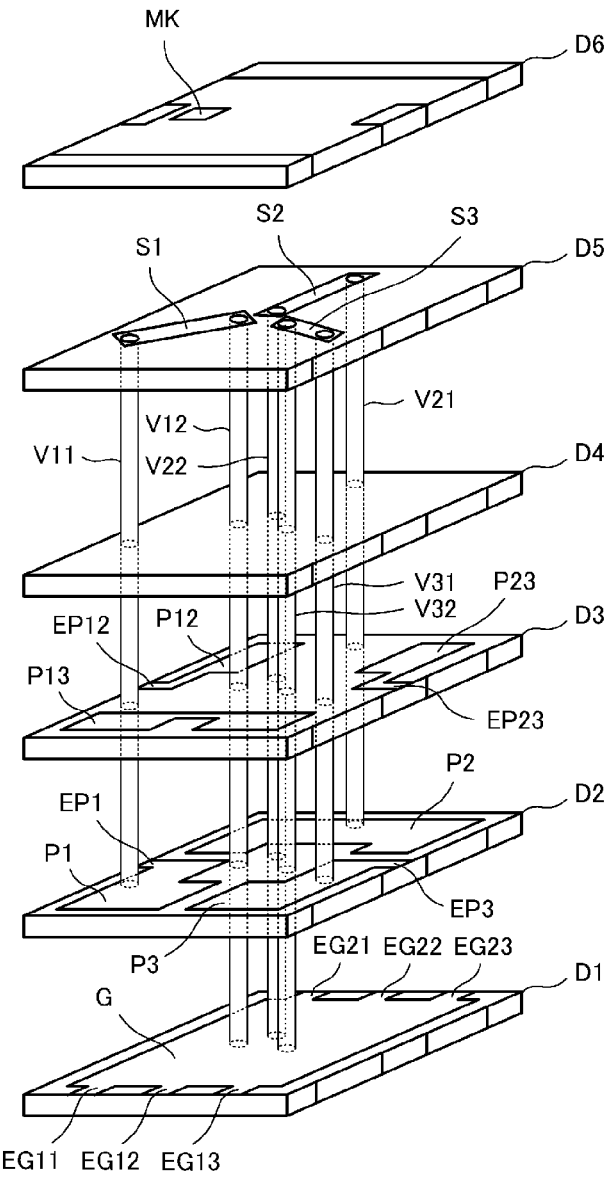
FIG. 2 is an exploded perspective view of a multilayer bandpass filter according to a first preferred embodiment of the present invention.
Figure 3:
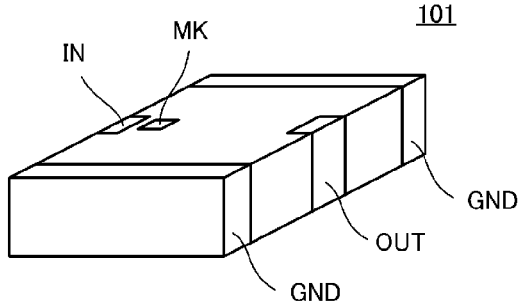
FIG. 3 is an external perspective view of the multilayer bandpass filter.

FIG. 2 is an exploded perspective view of a multilayer bandpass filter 101 according to the first preferred embodiment of the present invention. FIG. 3 is an external perspective view of the multilayer bandpass filter 101 according to the first preferred embodiment of the present invention.

The multilayer bandpass filter 101 includes three stages of LC parallel resonators. The first stage LC parallel resonator is connected to an input terminal, and the third stage LC parallel resonator is connected to an output terminal. The second stage LC parallel parameter is not connected to either the input terminal or the output terminal. A circuit configuration of the multilayer bandpass filter 101 will be described in detail later.

As illustrated in FIG. 2, the multilayer bandpass filter 101 is preferably a multilayer body including a plurality of dielectric layers D1 to D6. A ground electrode G is defined on an upper surface of the dielectric layer D1. The ground electrode G defines a second capacitor electrode for each of the first stage LC parallel resonator, the second stage LC parallel resonator, and the third stage LC parallel resonator.

Capacitor electrodes P1, P2, and P3 are arranged on an upper surface of the dielectric layer D2. The capacitor electrode P1 defines a first capacitor electrode of the first stage LC parallel resonator. The capacitor electrode P2 defines a first capacitor electrode of the second stage LC parallel resonator. The capacitor electrode P3 defines a first capacitor electrode of the third stage LC parallel resonator. The first capacitor electrodes P1, P2, and P3 face the ground electrode G (the second capacitor electrode), and define respective capacitors in between.

Capacitor electrodes P12, P23 and a jump-coupling capacitor electrode P13 arranged to couple the first stage LC parallel resonator and the third stage LC parallel resonator are respectively arranged on an upper surface of the dielectric layer D3. The capacitor electrode P12 faces the capacitor electrode P2, and defines a capacitor in between. The capacitor electrode P23 faces the capacitor electrode P2, and defines a capacitor in between. The jump-coupling capacitor electrode P13 faces the capacitor electrodes P1 and P3, and defines respective capacitors therebetween.

Line electrodes S1, S2, and S3 are arranged on an upper surface of the dielectric layer D5. The line electrode S1 includes a portion of an inductor electrode of the first stage LC parallel resonator. The line electrode S2 includes a portion of an inductor electrode of the second stage LC parallel resonator. The line electrode S3 includes a portion of an inductor electrode of the third stage LC parallel resonator.

Via electrodes V11, V21, and V31 are arranged in the dielectric layers D3, D4, and D5 so as to extend in a stacking direction of these dielectric layers. Furthermore, via electrodes V12, V22, V32 are provided in the dielectric layers D2, D3, D4, and D5 so as to extend in the stacking direction of these dielectric layers.

The via electrode V11 preferably extends from the capacitor electrode P1 to a first end portion of the line electrode S1. The via electrode V12 preferably extends from a second end portion of the line electrode S1 to the ground electrode G. The via electrode V21 preferably extends from the capacitor electrode P2 to a first end portion of the line electrode S2. The via electrode V22 preferably extends from a second end portion of the line electrode S2 to the ground electrode G. The via electrode V31 preferably extends from the capacitor electrode P3 to a first end portion of the line electrode S3. The via electrode V32 preferably extends from a second end portion of the line electrode S3 to the ground electrode G.

The via electrodes V11, V12 and the line electrode S1 define a loop shape of the inductor electrode of the first stage LC parallel resonator. The via electrodes V21, V22 and the line electrode S2 define a loop shape of the inductor electrode of the second stage LC parallel resonator. The via electrodes V31, V32 and the line electrode S3 define a loop shape of the inductor electrode of the third stage LC parallel resonator. Furthermore, all loop planes of the inductor electrodes of the first, second, and third stage LC parallel resonators are parallel to the stacking direction.

As described above, by stacking a plurality of the dielectric layers on which various electrode patterns are arranged, the multilayer body including a plurality of dielectric layers and a plurality of electrode layers is defined.

The inductor electrodes of the three LC parallel resonators are arranged such that loop planes of these inductor electrodes are disposed in a radial arrangement (i.e., expanding in a direction toward periphery of the multilayer body) about a center axis extending in the stacking direction of dielectric layers. Accordingly, the inductor electrode of the first stage LC parallel resonator connected to the input terminal is arranged next to the inductor electrode of the third stage LC parallel resonator connected to the output terminal.

This arrangement allows a filter's attenuation characteristics to be freely set by further utilizing electromagnetic coupling between the inductor electrodes of the input stage LC parallel resonator and the output stage LC parallel resonator.

As illustrated in FIG. 3, the input terminal IN, the output terminal OUT, and a ground terminal GND are preferably arranged on two opposite side surfaces (end surfaces) of the multilayer body. The ground terminal GND is electrically connected to lead electrodes EG11, EG12, EG13, EG21, EG22, and EG23 illustrated in FIG. 2. The input terminal IN is electrically connected to lead electrodes EP1 and EP12. The output terminal OUT is electrically connected to lead electrodes EP3 and EP23. Furthermore, a mark MK that indicates a position of the input terminal is preferably provided on an upper surface of the multilayer body.

A dielectric layer portion of each layer is preferably a Low Temperature Co-fired Ceramic (LTCC) having a permittivity in the range of about 6 to about 80. The dielectric layer stacked on the electrode layer including the foregoing line electrodes preferably has a relative permittivity in the range of about 6 to about 80. Furthermore, the dielectric layer on which the capacitor electrode is arranged preferably has a relative permittivity equal to or larger than about 20. Each dielectric layer is preferably made by using a low temperature sintered ceramic including, for example, a glass component and at least one or more components of titanium oxide, barium oxide, alumina, and the like. Materials similar to those which are used to make the respective dielectric layers will be used in other preferred embodiments described below.

Figure 4:
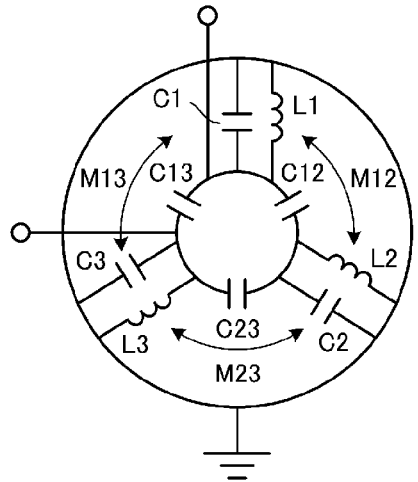
FIG. 4 is a diagram that additionally illustrates a spatial relationship among three LC parallel resonators according to a preferred embodiment of the present invention.
Figure 5:
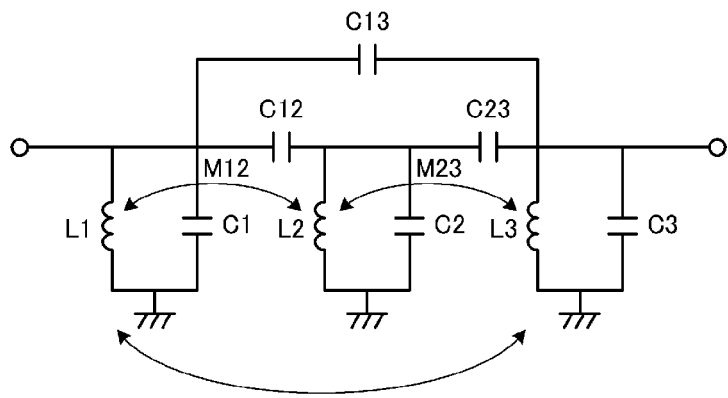
FIG. 5 is an equivalent circuit diagram of the multilayer bandpass filter of the first preferred embodiment of the present invention.

FIG. 4 and FIG. 5 are equivalent circuit diagrams of the multilayer bandpass filter 101 of the first preferred embodiment. FIG. 4 is the equivalent circuit diagram that additionally illustrates a spatial relationship among the three LC parallel resonators. FIG. 5 is the equivalent circuit diagram in a typical representation. In FIG. 4 and FIG. 5, an inductor L1 is an inductor including the via electrodes V11, V12 and the line electrode S1. An inductor L2 is an inductor including the via electrodes V21, V22 and the line electrode S2. An inductor L3 is an inductor including the via electrodes V31, V32 and the line electrode S3.

Furthermore, a capacitor C1 is a capacitor defined between the capacitor electrode P1 and the ground electrode G. A capacitor C2 is a capacitor defined between the capacitor electrode P2 and the ground electrode G. A capacitor C3 is a capacitor defined between the capacitor electrode P3 and the ground electrode G.

A capacitor C12 is a capacitor defined between the capacitor electrode P12 and the capacitor electrode P2. A capacitor C23 is a capacitor defined between the capacitor electrode P23 and the capacitor electrode P2. A capacitor C13 is a capacitor defined between the jump-coupling capacitor electrode P13 and the capacitor electrodes P1, P3.

The inductor L1 and the capacitor C1 define the first stage LC parallel resonator. The inductor L2 and the capacitor C2 define the second stage LC parallel resonator. The inductor L3 and the capacitor C3 define the third stage LC parallel resonator.

As illustrated in FIG. 2, the loop planes of the inductor electrodes, each of which includes the via electrodes and the line electrode, are arranged about the center axis extending in the stacking direction of dielectric layers with a predetermined angle (preferably about 120 degrees) in between. Thus, the adjacent inductor electrodes electromagnetically couple to each other. Electromagnetic coupling M12 illustrated in FIG. 4 and FIG. 5 represents the electromagnetic coupling between the first stage LC parallel resonator and the second stage LC parallel resonator. Electromagnetic coupling M23 represents the electromagnetic coupling between the second stage LC parallel resonator and the third stage LC parallel resonator. Electromagnetic coupling M13 represents the electromagnetic coupling between the first stage LC parallel resonator and the third stage LC parallel resonator.

By arranging the first stage LC parallel resonator with the third stage LC parallel resonator as in the present preferred embodiment, the input stage (first stage) LC parallel resonator and the output stage (third stage) LC parallel resonator may be coupled through the electromagnetic coupling M13 in addition to the jump-coupling with the capacitor C13.

Figure 6:
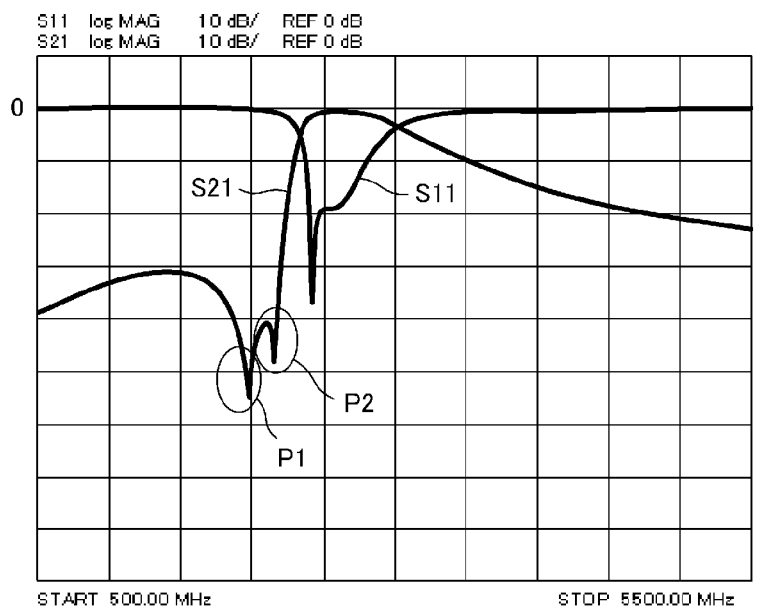
FIG. 6 is a diagram illustrating a transmission characteristic and a reflection characteristic of the multilayer bandpass filter of the first preferred embodiment of the present invention.

FIG. 6 is a diagram illustrating a transmission characteristic (S21 characteristic of S parameter) and a reflection characteristic (S11 characteristic of S parameter) of the multilayer bandpass filter 101 of the first preferred embodiment. In FIG. 6, an attenuation pole P1 is due to the jump-coupling between the first stage LC parallel resonator and the third stage LC parallel resonator. An attenuation pole P2 is due to the coupling between the first stage LC parallel resonator and the second stage LC parallel resonator as well as the coupling between the second stage LC parallel resonator and the third stage LC parallel resonator.

According to the first preferred embodiment, the inductor electrode of the first stage LC parallel resonator and the inductor electrode of the third stage LC parallel resonator may be electromagnetically coupled, and the degree of coupling may be arbitrarily set. Accordingly, the degree of coupling between the inductor electrodes of the first stage LC parallel resonator and the third stage LC parallel resonator, the degree of coupling between the inductor electrodes of the first stage LC parallel resonator and the second stage LC parallel resonator, or the degree of coupling between the inductor electrodes of the second stage LC parallel resonator and the third stage LC parallel resonator may be increased as desired. Accordingly, the attenuation poles due to the coupling between the resonators may be freely adjusted at will. Thus, a wider range is available for the attenuation pole adjustment as compared to the case where a multilayer bandpass filter has a conventional structure.

As illustrated in FIG. 2, the input stage (first stage) LC parallel resonator and the output stage (third stage) LC parallel resonator are preferably arranged next to each other. Thus, the jump-coupling capacitor electrode P13 may be arranged at a position where, when viewed in the stacking direction of dielectric layers, the jump-coupling capacitor electrode P13 overlaps with the capacitor electrode P1 of the input stage LC parallel resonator and the capacitor electrode P3 of the output stage LC parallel resonator, and does not overlap with the capacitor electrode P2 of the other (second stage) LC parallel resonator. According to this structure, the jump-coupling capacitor electrode P13 may establish the jump-coupling without overlapping with the second stage LC parallel resonator. Accordingly, unwanted parasitic capacitance may be reduced without increasing a size of the multilayer bandpass filter 101 such that a device's Q characteristic will improve.

In the first preferred embodiment, the loop planes of the inductor electrodes of the three LC parallel resonators are arranged about the center axis with an equal angle (preferably about 120 degrees) in between. Thus, when all the LC parallel resonators have the same resonance characteristic, arranging the three inductor electrodes with the equal angle in between provides a filter in which the same attenuation characteristic can be obtained irrespective of the resonator's positions to which input/output electrodes are connected. Accordingly, the degree of freedom in arranging the input terminal and the output terminal may be high.

Alternatively, the loop planes of the inductor electrodes, each of which includes the via electrodes and the line electrode, of the three LC parallel resonators may be arranged about the center axis extending in the stacking direction of dielectric layers with unequaled angles in between. In other words, the electromagnetic coupling between adjacent LC parallel resonators may be set by varying those angles.

Second Preferred Embodiment

Figure 7:
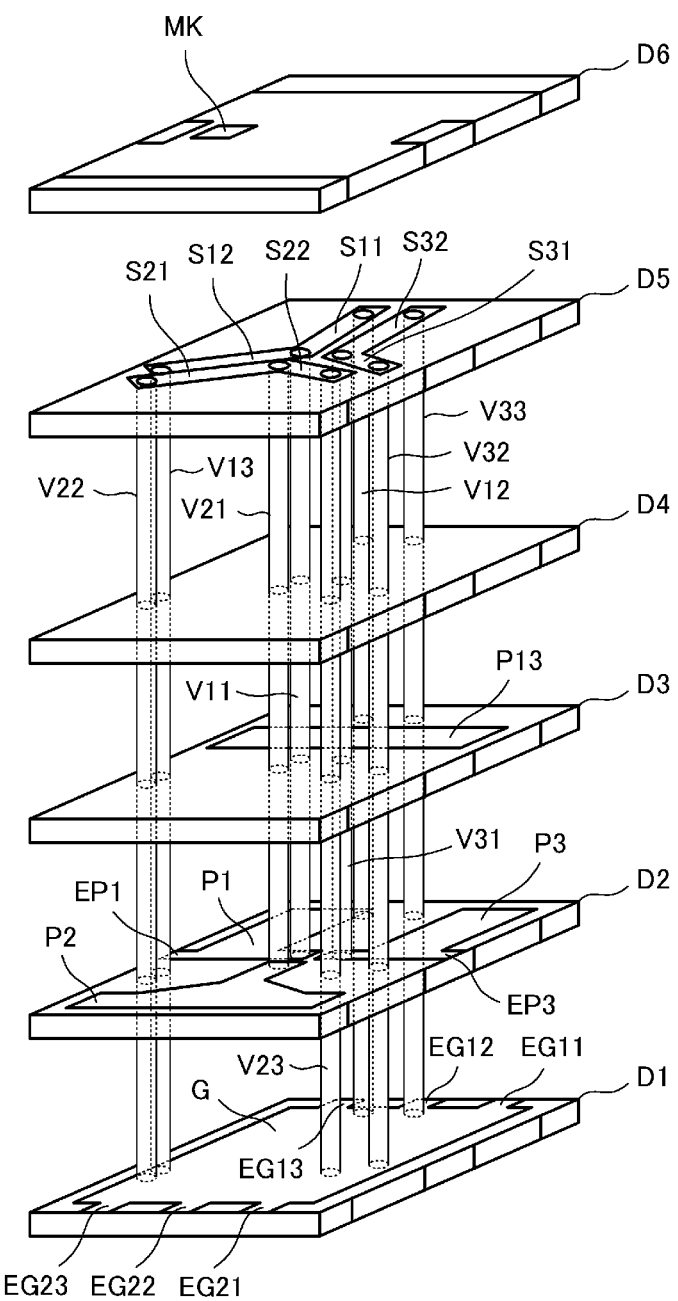
FIG. 7 is an exploded perspective view of a multilayer bandpass filter according to a second preferred embodiment of the present invention.

FIG. 7 is an exploded perspective view of a multilayer bandpass filter 102 according to the second preferred embodiment of the present invention.

The multilayer bandpass filter 102 preferably includes three stages of LC parallel resonators. The first stage LC parallel resonator is connected to an input terminal, and the third stage LC parallel resonator is connected to an output terminal. The second stage LC parallel parameter is connected to neither the input terminal nor the output terminal. The multilayer bandpass filter 102 preferably includes the same circuit configuration as that of the first preferred embodiment.

As illustrated in FIG. 7, the multilayer bandpass filter 102 is preferably a multilayer body including a plurality of dielectric layers D1 to D6. A ground electrode G is arranged on an upper surface of the dielectric layer D1. The ground electrode G defines a second capacitor electrode of each of the first stage LC parallel resonator, the second stage LC parallel resonator, and the third stage LC parallel resonator.

Capacitor electrodes P1, P2, and P3 are arranged on an upper surface of the dielectric layer D2. The capacitor electrode P1 defines a first capacitor electrode of the first stage LC parallel resonator. The capacitor electrode P2 defines a first capacitor electrode of the second stage LC parallel resonator. The capacitor electrode P3 defines a first capacitor electrode of the third stage LC parallel resonator. These first capacitor electrodes P1, P2, and P3 face the ground electrode G (the second capacitor electrode), and define respective capacitors in between.

A jump-coupling capacitor electrode P13 is preferably arranged on an upper surface of the dielectric layer D3. The jump-coupling capacitor electrode P13 faces the capacitor electrodes P1 and P3, and defines respective capacitors in between.

Line electrodes S11, S12, S21, S22, S31, and P32 are arranged on an upper surface of the dielectric layer D5. The line electrodes S11 and S12 are a portion of an inductor electrode of the first stage LC parallel resonator. The line electrodes S21 and S22 are a portion of an inductor electrode of the second stage LC parallel resonator. The line electrodes S31 and S32 are a portion of an inductor electrode of the third stage LC parallel resonator.

Via electrodes V11, V21, and V31 are provided in the dielectric layers D3, D4, and D5 so as to extend in a stacking direction of these dielectric layers. Via electrodes V12, V13, V22, V23, V32, and V33 are provided in the dielectric layers D2, D3, D4, and D5 so as to extend in the stacking direction of these dielectric layers.

The via electrode V11 preferably extends from the capacitor electrode P1 to respective first end portions of the line electrodes S1 and S2 (a connecting point of the line electrode S11 and the line electrode S12). The via electrode V12 preferably extends from a second end portion of the line electrode S11 to the ground electrode G. The via electrode V13 preferably extends from a second end portion of the line electrode S12 to the ground electrode G. The via electrode V21 preferably extends from the capacitor electrode P2 to respective first end portions of the line electrodes S21 and S22. The via electrode V22 preferably extends from a second end portion of the line electrode S21 to the ground electrode G. The via electrode V23 preferably extends from a second end portion of the line electrode S22 to the ground electrode G. The via electrode V31 preferably extends from the capacitor electrode P3 to respective first end portions of the line electrodes S31 and S32. The via electrode V32 preferably extends from a second end portion of the line electrode S31 to the ground electrode G. The via electrode V33 preferably extends from a second end portion of the line electrode S32 to the ground electrode G.

The via electrodes V11, V12, V13 and the line electrodes S11, S12 define a loop shaped inductor electrode of the first stage LC parallel resonator. The via electrodes V21, V22, V23 and the line electrodes S21, S22 define a loop shaped inductor electrode of the second stage LC parallel resonator. The via electrodes V31, V32, V33 and the line electrodes S31, S32 define a loop shaped inductor electrode of the third stage LC parallel resonator.

The first end portion of the inductor electrode of the first stage LC parallel resonator is preferably the connecting point of the via electrode V11 to the capacitor electrode P1. The second end portions of the inductor electrode of the first stage LC parallel resonator are preferably the connecting points of the via electrodes V12 and V13 to the ground electrode G. In other words, the second end portion of the inductor electrode is provided at two places, and the loop plane of the inductor electrode includes two planes. The via electrodes V11, V12 and the line electrode S11 define a first loop plane, and the via electrodes V11, V13 and the line electrode S12 define a second loop plane.

The same applies to the second and third stage LC parallel resonators. These inductor electrodes are arranged about a center axis such that the inductor electrodes are disposed while preferably satisfying an equal angle relationship of about 120 degrees among them.

According to the second preferred embodiment, the loop plane of each inductor electrode preferably includes two planes, and all the planes are arranged parallel or substantially parallel to the stacking direction. Furthermore, one of the two planes of the loop plane in the inductor electrode of each LC parallel resonator faces a counterpart of the adjacent LC parallel resonator parallel or substantially parallel to each other. Thus, the electromagnetic coupling between the adjacent LC parallel resonators may be strengthened.

In the example illustrated in FIG. 7, the adjacent LC parallel resonators are arranged such that one of the two planes of the loop plane of one LC parallel resonator faces a counterpart of the adjacent LC parallel resonator in parallel or substantially in parallel to each other. However, the degree of coupling between the LC parallel resonators may be set by adjusting an angle between those planes of the respective loop planes. Alternatively, the degree of coupling between the adjacent LC parallel resonators may be set by adjusting a distance between the loop planes of the adjacent LC parallel resonators.

The center axis extending in the stacking direction of dielectric layers is not limited to an axis that goes through a center of the multilayer body, and may be a different axis so long as that axis can serve as a radial center of a plurality of the inductor electrodes.

In the foregoing preferred embodiments, the examples including three stages of LC parallel resonators are described.

Alternatively, four or more stages of LC parallel resonators may be included. Even in the case where four or more stages are included, the input stage LC parallel resonator and the output stage LC parallel resonator are arranged next to each other. Accordingly, the electromagnetic coupling between the input stage LC parallel resonator and the output stage LC parallel resonator may be easily set.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer bandpass filter comprising:
a plurality of LC parallel resonators including three or more LC parallel resonators, each of which includes a first capacitor electrode, a second capacitor electrode, and an inductor electrode; and
a multilayer body that includes a plurality of dielectric layers and a plurality of electrode layers; wherein
the plurality of electrode layers define the first capacitor electrode, the second capacitor electrode, and the inductor electrode of each of the plurality of LC parallel resonators;
in each of the plurality of LC parallel resonators, the second capacitor electrode faces the first capacitor electrode, and the inductor electrode defines a loop, the loop including a first end portion that defines a start point and connects to the first capacitor electrode, and a second end portion that defines an end point and connects to the second capacitor electrode;
in each of the plurality of LC parallel resonators, the inductor electrode includes a line electrode arranged along a respective one of the plurality of dielectric layers and a via electrode extending in a stacking direction of the plurality of dielectric layers; and
the inductor electrodes of the plurality of LC parallel resonators are arranged such that loop planes of the inductor electrodes are disposed in a radial arrangement about a center axis extending in the stacking direction of the plurality of dielectric layers, and such that the inductor electrode of one of the plurality of LC parallel resonators at an input stage and the inductor electrode of one of the plurality of LC parallel resonators at an output stage are next to each other.

2. The multilayer bandpass filter according to claim 1, wherein the plurality of LC parallel resonators includes a first stage LC parallel resonator that defines the one of the plurality of LC parallel resonators at the input stage, a third stage LC parallel resonator that defines the one of the plurality of LC parallel resonators at the output stage, and a second stage LC parallel resonator.

3. The multilayer bandpass filter according to claim 2, wherein the loop planes of the inductor electrodes of the first stage LC parallel resonator, the second stage LC parallel resonator, and the third stage LC parallel resonator are arranged about the center axis with an equal or substantially equal angle therebetween.

4. The multilayer bandpass filter according to claim 3, wherein the equal or substantially equal angle is about 120 degrees.

5. The multilayer bandpass filter according to claim 2, wherein the line electrodes of each of the plurality of LC parallel resonators includes two extending portions, each of the two extending portions extending in parallel or substantially in parallel with one extending portion of another of the line electrodes.

6. The multilayer bandpass filter according to claim 1, wherein the second end portion of the inductor electrode of each of the plurality of LC parallel resonators is provided at two locations, the loop plane of each inductor electrode includes two planes, and the loop planes of the inductor electrodes of adjacent ones of the plurality of LC parallel resonators face each other and are in parallel or substantially in parallel to each other.

7. The multilayer bandpass filter according to claim 2, wherein the inductor electrode of the second stage LC parallel resonator is located next to both the inductor electrode of the first stage LC parallel resonator and the inductor electrode of the third stage LC parallel resonator.

8. The multilayer bandpass filter according to claim 2, further comprising:
a first capacitor connected between the first stage LC parallel resonator and the second stage LC parallel resonator; and
a second capacitor connected between the second stage LC parallel resonator and the third stage LC parallel resonator.

9. The multilayer bandpass filter according to claim 1, wherein the multilayer body includes a jump-coupling capacitor electrode arranged to couple the one of the plurality of LC parallel resonators at the input stage and the one of the plurality of LC parallel resonators at the output stage.

10. The multilayer bandpass filter according to claim 9, wherein the jump-coupling capacitor electrode is arranged at a position where, when viewed in the stacking direction of the plurality of dielectric layers, the jump-coupling capacitor electrode overlaps with the first capacitor electrode of the one of the plurality of LC parallel resonators at the input stage and the first capacitor electrode of the one of the plurality of LC parallel resonators at the output stage, and does not overlap with the first capacitor electrode of another one of the plurality of LC parallel resonators.

11. A multilayer bandpass filter comprising:
three LC parallel resonators, each of which includes a first capacitor electrode, a second capacitor electrode, and an inductor electrode; and
a multilayer body that includes a plurality of dielectric layers and a plurality of electrode layers; wherein
the plurality of electrode layers defines the first capacitor electrode, the second capacitor electrode and the inductor electrode of each of the three LC parallel resonators;
in each of the three LC parallel resonators, the second capacitor electrode faces the first capacitor electrode, and the inductor electrode defines a loop, the loop including a first end portion that defines a start point and connects to the first capacitor electrode, and a second end portion that defines an end point and connects to the second capacitor electrode;
in each of the three LC parallel resonators, the inductor electrode includes a line electrode arranged along a respective of the plurality of dielectric layers and a via electrode extending in a stacking direction of the plurality of dielectric layers; and the inductor electrodes of the three LC parallel resonators are arranged such that loop planes of the inductor electrodes are disposed in a radial arrangement about a center axis extending in the stacking direction of the plurality of dielectric layers, and the loop planes of the three LC parallel resonators are arranged about the center axis with an equal or substantially equal angle therebetween.

12. The multilayer bandpass filter according to claim 11, wherein the three LC parallel resonators include an LC parallel resonator at an input stage and an LC parallel resonator at an output stage, the inductor electrodes of the LC parallel resonator at the input stage and the LC parallel resonator at the output stage are next to each other.

13. The multilayer bandpass filter according to claim 12, wherein the inductor electrode of a second one of the LC parallel resonators is next to both the inductor electrode of a first one of the three LC parallel resonators and the inductor electrode of a third one of the three LC parallel resonators.

14. The multilayer bandpass filter according to claim 11, wherein the multilayer body includes a jump-coupling capacitor electrode arranged to couple one of the three LC parallel resonators at an input stage and one of the three LC parallel resonators at an output stage.

15. The multilayer bandpass filter according to claim 14, wherein the jump-coupling capacitor electrode is arranged at a position where, when viewed in the stacking direction of the plurality of dielectric layers, the jump-coupling capacitor electrode overlaps with the first capacitor electrode of the one of the three LC parallel resonators at the input stage and the first capacitor electrode of the one of the three LC parallel resonators at the output stage, and does not overlap with the first capacitor electrode of another one of the three LC parallel resonators.

16. The multilayer bandpass filter according to claim 11, wherein the second end portion of the inductor electrode of each of the three LC parallel resonators is provided at two locations, the loop plane of each inductor electrode includes two planes, and the loop planes of the inductor electrodes of adjacent ones of the three LC parallel resonators face each other and are in parallel or substantially in parallel to each other.

17. The multilayer bandpass filter according to claim 11, further comprising:
a first capacitor connected between a first one of the three LC parallel resonators and a second one of the three LC parallel resonators; and
a second capacitor connected between the second one of the three LC parallel resonators and a third one of the three LC parallel resonators.

18. The multilayer bandpass filter according to claim 11, wherein the equal or substantially equal angle is about 120 degrees.

19. The multilayer bandpass filter according to claim 11, wherein the line electrode of each of the three LC parallel resonators includes two extending portions, each of the two extending portions extending in parallel or substantially in parallel with one extending portion of another of the line electrodes.

20. The multilayer bandpass filter according to claim 19, wherein the line electrodes are substantially V-shaped.

* * * * *